(12) United States Patent
Kim (10) Patent No.: US 9,135,969 B2
(45) Date of Patent: Sep. 15, 2015

(54) SEMICONDUCTOR DEVICE

(71) Applicant: SK hynix Inc., Gyeonggi-do (KR)

(72) Inventor: Kwi-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/299,864

(22) Filed: Jun. 9, 2014

(65) Prior Publication Data

US 2015/0179241 A1 Jun. 25, 2015

(30) Foreign Application Priority Data

Dec. 19, 2013 (KR) .......................... 10-2013-0159284

(51) Int. Cl.
*G11C 29/44* (2006.01)
*G11C 7/22* (2006.01)
*G11C 17/16* (2006.01)
*G11C 29/02* (2006.01)
*G11C 29/00* (2006.01)

(52) U.S. Cl.
CPC ................ *G11C 7/222* (2013.01); *G11C 17/16* (2013.01); *G11C 29/027* (2013.01); *G11C 29/44* (2013.01); *G11C 29/4401* (2013.01); *G11C 29/785* (2013.01); *G11C 29/802* (2013.01); *G11C 2029/4402* (2013.01)

(58) Field of Classification Search
CPC ............... G11C 29/785; G11C 29/802; G11C 29/4401; G11C 29/44; G11C 29/027; G11C 2029/4402
See application file for complete search history.

(56) References Cited

U.S. PATENT DOCUMENTS

2012/0120733 A1 5/2012 Son et al.
2013/0322183 A1* 12/2013 Jeong ...................... 365/189.05

FOREIGN PATENT DOCUMENTS

KR 1020140139854 12/2014

* cited by examiner

*Primary Examiner* — Huan Hoang
*Assistant Examiner* — Roberto Mancera
(74) *Attorney, Agent, or Firm* — IP & T GROUP LLP (57) ABSTRACT

A semiconductor device may include a nonvolatile storage unit, a select signal generation unit suitable for generating a plurality of select signals using a clock, a plurality of storage units suitable for storing data transmitted from the nonvolatile storage unit in response to the plurality of select signals, respectively, and a clock blocking unit suitable for blocking the clock inputted to the select signal generation unit when the data transmitted from the nonvolatile storage unit is the same as the data stored in the plurality of storage units.

20 Claims, 6 Drawing Sheets

SEMICONDUCTOR DEVICE

CROSS-REFERENCE TO RELATED APPLICATIONS

The present application claims priority of Korean Patent Application No. 10-2013-0159284, filed on Dec. 19, 2013, which is incorporated herein by reference in its entirety.

BACKGROUND

1. Field

Exemplary embodiments of the present invention relate to a semiconductor device.

2. Description of the Related Art

Figure 1:
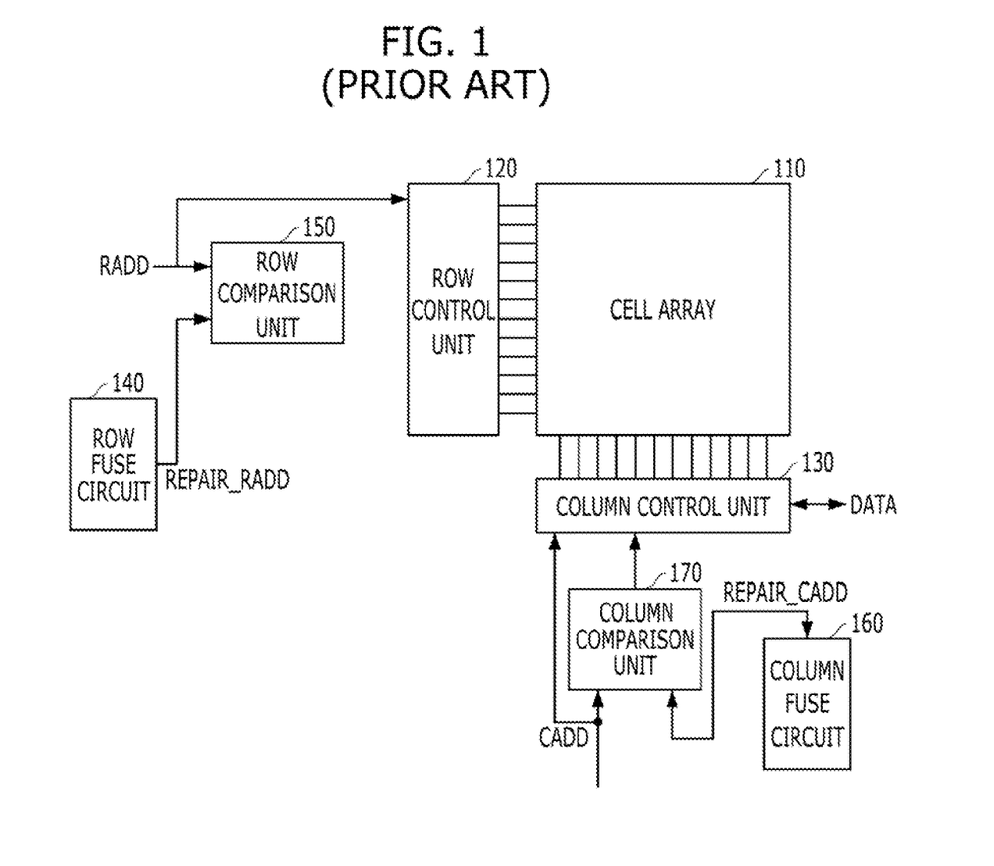
FIG. 1 is a diagram for explaining a repair operation of a semiconductor memory device.

FIG. 1 is a diagram for explaining a repair operation of a semiconductor memory device.

Referring to FIG. 1, a semiconductor memory device may include a cell array 110, a row control unit 120, and a column control unit 130. The cell array 110 may include a plurality of memory cells, the row control unit 120 may enable a word line selected by a row address RADD, and the column control unit 130 may access (read or write) data of a bit line selected by a column address CADD.

A row fuse circuit 140 may store a row address, corresponding to a memory cell having a defect in the cell array 110, as a repair row address REPAIR_RADD. A row comparison unit 150 may compare the repair row address REPAIR_RADD stored in the row fuse circuit 140 to a row address RADD inputted from outside the memory device. When the repair row address REPAIR_RADD coincides with the row address RADD, the row comparison unit 150 may control the row control unit 120 to enable a redundancy word line instead of a word line designated by the row address RADD.

A column fuse circuit 160 may store a column address, corresponding to a memory cell having a defect in the cell array 110, as a repair column address REPAIR_CADD. A column comparison unit 170 may compare the repair column address REPAIR_CADD stored in the column fuse circuit 160 to a column address CADD inputted from outside the memory device. When the repair column address REPAIR_CADD coincides with the column address CADD, the column comparison unit 170 may control the column control unit 130 to access a redundancy bit line instead of a bit line designated by the column address CADD.

The fuse circuits 140 and 160 of FIG. 1 may include a laser fuse. The laser fuse may store logic high or low data depending on whether the fuse is cut or not. The laser fuse may be programmed at a wafer level, but cannot be programmed after a wafer is mounted in a package. Furthermore, the laser fuse is difficult to be designed in a small size, due to a pitch limit. In order to overcome such a disadvantage, an E-fuse may be used. The E-fuse may be formed using a transistor or a capacitor resistor. When the E-fuse is formed using a transistor, the E-fuse may store data by changing resistance between gate and drain/source.

Figure 2:
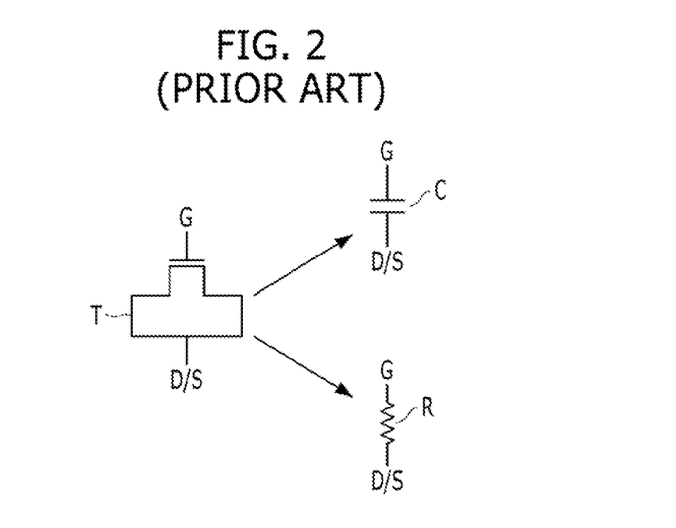
FIG. 2 is a diagram of an E-fuse formed of a transistor and operating as a resistor or a capacitor.

FIG. 2 is a diagram illustrating an E-fuse formed of a transistor and operating as a resistor or a capacitor.

Referring to FIG. 2, the E-fuse may include a transistor T. When a normal power supply voltage which the transistor T can stand is applied to a gate G, the E-fuse operates as a capacitor C. Thus, no current flows between the gate G and a drain-source D/S. However, when a high voltage which the transistor T cannot stand is applied to the gate G, the gate G and the drain-source D/S are short-circuited while gate oxide of the transistor T is broken. Then, the E-fuse operates as a resistor R. Thus, current may flow between the gate G and the drain-source D/S.

Data of the E-fuse may be recognized through the resistance value between the gate G and the drain-source D/S of the E-fuse. The data of the E-fuse may be directly recognized without a separate amplifying operation when the E-fuse is large. When the E-fuse is small, on the other hand, an amplifier may be used to sense a current flowing through the transistor T thereof. The above-described two methods have area limits because the transistor T forming the E-fuse needs to be large or the amplifier for amplifying data needs to be provided for each E-fuse.

Due to the above-described area issues, it is not easy to apply the E-fuse to fuse circuits 140 and 160. Thus, research has been conducted on a method in which E-fuses are formed in an array, and a repair operation is performed using data stored in the E-fuse array. When the E-fuses are formed in an array, an amplifier may be shared to reduce the total area consumed.

In the case of a semiconductor device including a nonvolatile storage unit such as an E-fuse array, repair data stored in the E-fuse array may be transmitted to storage units included in the semiconductor device, for example, latches, during a boot-up operation, in order to use the repair data stored in the E-fuse array. When the duplicate repair data is stored in the nonvolatile storage unit, an error may occur in the operation of the semiconductor device when the duplicate data is transmitted to the storage units.

SUMMARY

Various embodiments of the present invention are directed to a semiconductor device which is capable of reducing error by preventing duplicate data from being stored in storage units, when repair data stored in nonvolatile storage units of the semiconductor device are transmitted to the storage units of the semiconductor device.

In an embodiment of the present invention, a semiconductor device may include a nonvolatile storage unit, a select signal generation unit suitable for generating a plurality of select signals using a clock, a plurality of storage units suitable for storing data transmitted from the nonvolatile storage unit in response to the plurality of select signals, respectively, and a clock blocking unit suitable for blocking the clock inputted to the select signal generation unit when the data transmitted from the nonvolatile storage unit is the same as the data stored in the plurality of storage units.

The nonvolatile storage unit may include first to M-th fuse sets, and sequentially store data in the first to M-th fuse sets, wherein the M is natural number.

The semiconductor device may further include a plurality of comparison units suitable for outputting comparison results obtained by comparing data outputted from the respective storage units to the data transmitted from the nonvolatile storage unit.

The select signal generation unit may include an address generator suitable for counting the clock and generating an address, and a decoder suitable for decoding the address and generating the plurality of select signals.

In another embodiment of the present invention, a semiconductor device may include a nonvolatile storage unit suitable for storing repair data, a select signal generation unit suitable for generating a plurality of select signals using a clock, a plurality of storage units suitable for storing the repair data transmitted from the nonvolatile storage unit in response to the plurality of select signals, a clock control unit suitable for blocking the clock inputted to the select signal generation unit when the data transmitted from the nonvolatile storage unit is the same as the data stored in the plurality of storage units, and a cell array suitable for replacing a normal cell with a redundancy cell using data stored in the plurality of storage units.

The nonvolatile storage unit may include first to M-th fuse sets, and sequentially store the repair data in the first to M-th fuse sets, where M is natural number.

The semiconductor device may further include a first data bus suitable for transmitting repair data outputted from the nonvolatile storage unit, a second data bus suitable for transmitting an input address inputted to the semiconductor device, a bus selection unit suitable for selecting and outputting data transmitted from the first data bus during a boot-up operation, and selecting and outputting data transmitted from the second data bus during an access operation, and a third data bus suitable for transmitting data outputted from the bus selection unit to the plurality of storage units.

The semiconductor device may further include a plurality of comparison units suitable for outputting comparison results obtained by comparing data outputted from the respective storage units to data transmitted from the third data bus.

The semiconductor device may further include a same signal generation unit suitable for generating a same signal, which is enabled when one or more of the storage units store the same data as the data transmitted from the third data bus and disabled when the storage units store different data from the data transmitted from the third data bus, based on the comparison.

In a further embodiment of the present invention, a semiconductor device may include a nonvolatile storage unit suitable for storing and sequentially transmitting a plurality of data, one or more storage units suitable for storing data transmitted from the nonvolatile storage unit in response to respective select signals, one or more comparison units suitable for comparing data stored in the respective storage units with the data transmitted from the nonvolatile storage unit and outputting a comparison result, and a select signal generation unit suitable for sequentially enabling the select signals using a clock based on the comparison result.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts of the various figures and embodiments of the present invention.

Figure 3:
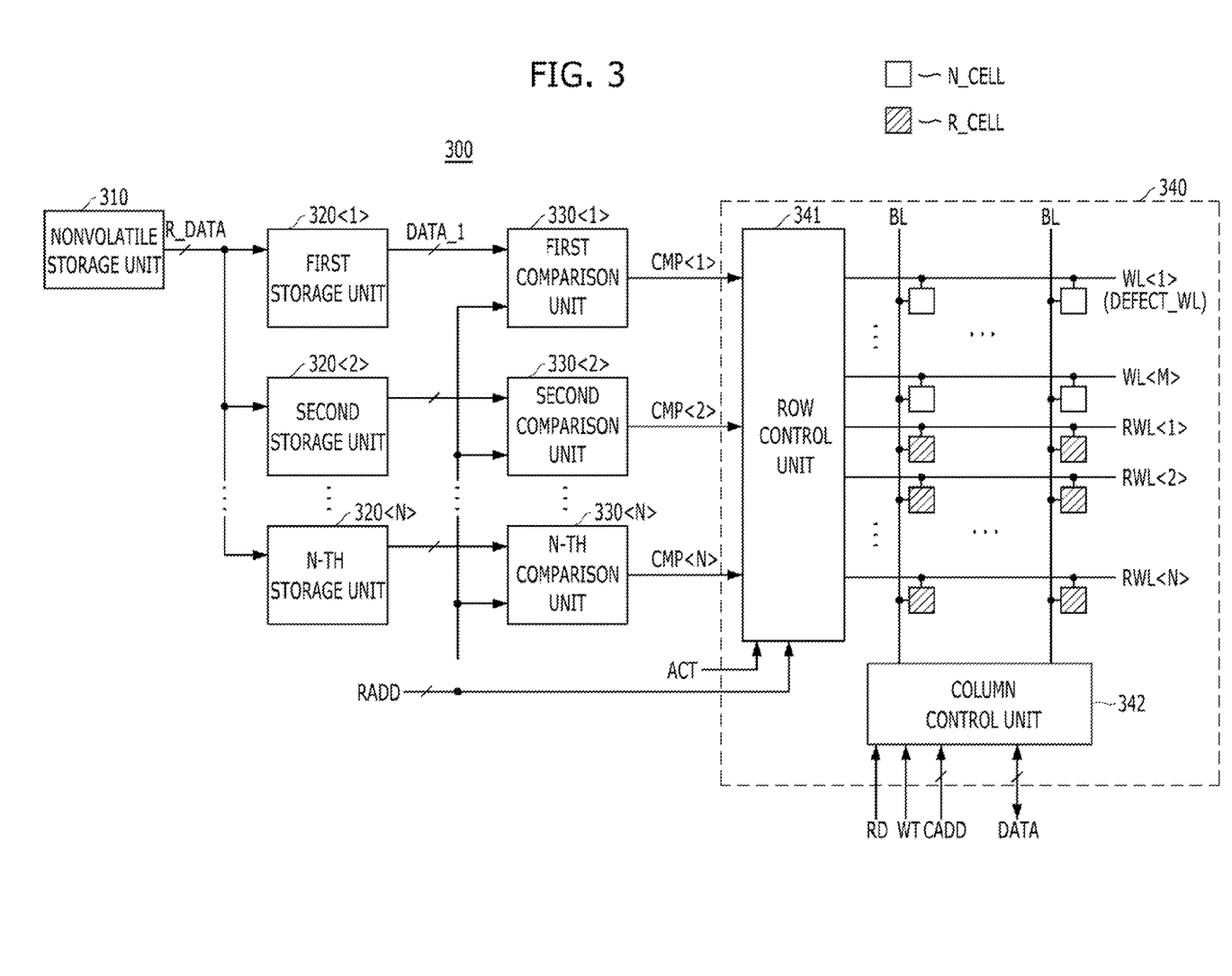
FIG. 3 is a diagram for explaining an error which occurs when duplicate repair data R_DATA is transmitted to first to N-th storage units 320<1:N> from a nonvolatile storage unit 130.

FIG. 3 is a diagram for explaining an error which occurs when duplicate repair data R_DATA is transmitted to first to N-th storage units 320<1:N> from a nonvolatile storage unit 130.

A semiconductor device 300 may include a nonvolatile storage unit 310, first to N-th storage units 320<1:N>, first to N-th comparison units 330<1:N>, and a cell array 340.

The cell array 340 may include a plurality of normal cells N_CELL and a plurality of redundancy cells R_CELL. The plurality of normal cells N_CELL and the plurality of redundancy cells R_CELL may be coupled to word lines WL<1:M> and RWL<1:N> and bit lines BL. The cell array 340 may include a row control unit 341 and a column control unit 342 for controlling the normal cells N_CELL and the redundancy cells R_CELL.

The row control unit 341 may activate a word line WL corresponding to a row address RADD or activate a redundancy word line RWL corresponding to an enabled comparison signal among first to N-th comparison signals CMP<1:N>, when an active signal ACT is enabled. The column control unit 342 may write or read data DATA to or from cells N_CELL and R_CELL coupled to bit lines BL corresponding to a column address CADD, among cells N_CELL and R_CELL coupled to an activated word line WL or RWL, when a write signal WT or a read signal RD is enabled.

The nonvolatile storage unit 310 may store addresses of normal cells N_CELL to be replaced with redundancy cells R_CELL. Hereafter, these addresses will be referred to as repair addresses. The nonvolatile storage unit 310 may transmit the repair addresses as repair data R_DATA to the first to N-th storage units 320<1:N>, during a boot-up operation.

The first to N-th storage units 320<1:N> may be sequentially enabled to store the transmitted repair data R_DATA during the boot-up operation. That is, during the boot-up operation, one or more repair addresses may be sequentially transmitted to the first to N-th storage units 320<1:N> from the nonvolatile storage unit 310, and then sequentially stored in the first to N-th storage units 320<1:N>.

The first to N-th comparison units 330<1:N> may compare data DATA_1 to DATA_N outputted from the respective storage units 320<1:N> to the row address RADD and enable the first to N-th comparison signals CMP<1:N>, respectively. When the active signal ACT is enabled, the row control unit 341 may activate a word line WL corresponding to the row address RADD when all of the first to N-th comparison signals CMP<1:N> are disabled, and activate a corresponding redundancy word line RWL when the first to N-th comparison signals CMP<1:N> are enabled.

Based on the above-described configuration, the following descriptions will be focused on an error which occurs when the same repair address is stored in two storage units among the first to N-th storage units 320<1:N>. That is, an error which occurs when duplicate repair data R_DATA is transmitted to the first to N-th storage units 320<1:N> from the nonvolatile storage unit 310 during a boot-up operation will be described.

A semiconductor device passes through a plurality of tests during a production process, and stores an address of a word line, at which a defect is detected, in the nonvolatile storage unit 310 in each test. In this case, a repair address corresponding to a defective word line DEFECT_WL may be detected in two or more different tests, and repetitively stored in the nonvolatile storage unit 310.

During a boot-up operation, repair data R_DATA is sequentially transmitted to the first to N-th storage units 320<1:N> from the nonvolatile storage unit 310 and then stored in the first to N-th storage units 320<1:N>. Since the nonvolatile storage unit 310 stores two repair addresses corresponding to the defective word line DEFECT_WL, the same repair address is stored in two storage units among the first to N-th storage units 320<1:N>. For example, the repair address of the defective word line DEFECT_WL may be stored in the first and second storage units 320<1:2>.

When an active command ACT and a row address RADD of the defective word line DEFECT_WL are applied to the semiconductor device after the boot-up operation is completed, the first to N-th comparison units 330<1:N> may compare data DATA_1 to DATA_N outputted from the corresponding storage units to the row address RADD, and the first comparison signal CMP<1> and the second comparison signal CMP<2> may be enabled at the same time. The row control unit 341 may activate two redundancy word lines RWL<1:2> corresponding to the enabled first and second comparison signals CMP<1:2>. Then, data of redundancy cells R_CELL coupled to the redundancy word lines RWL<1:2> may collide with each other.

Figure 4:
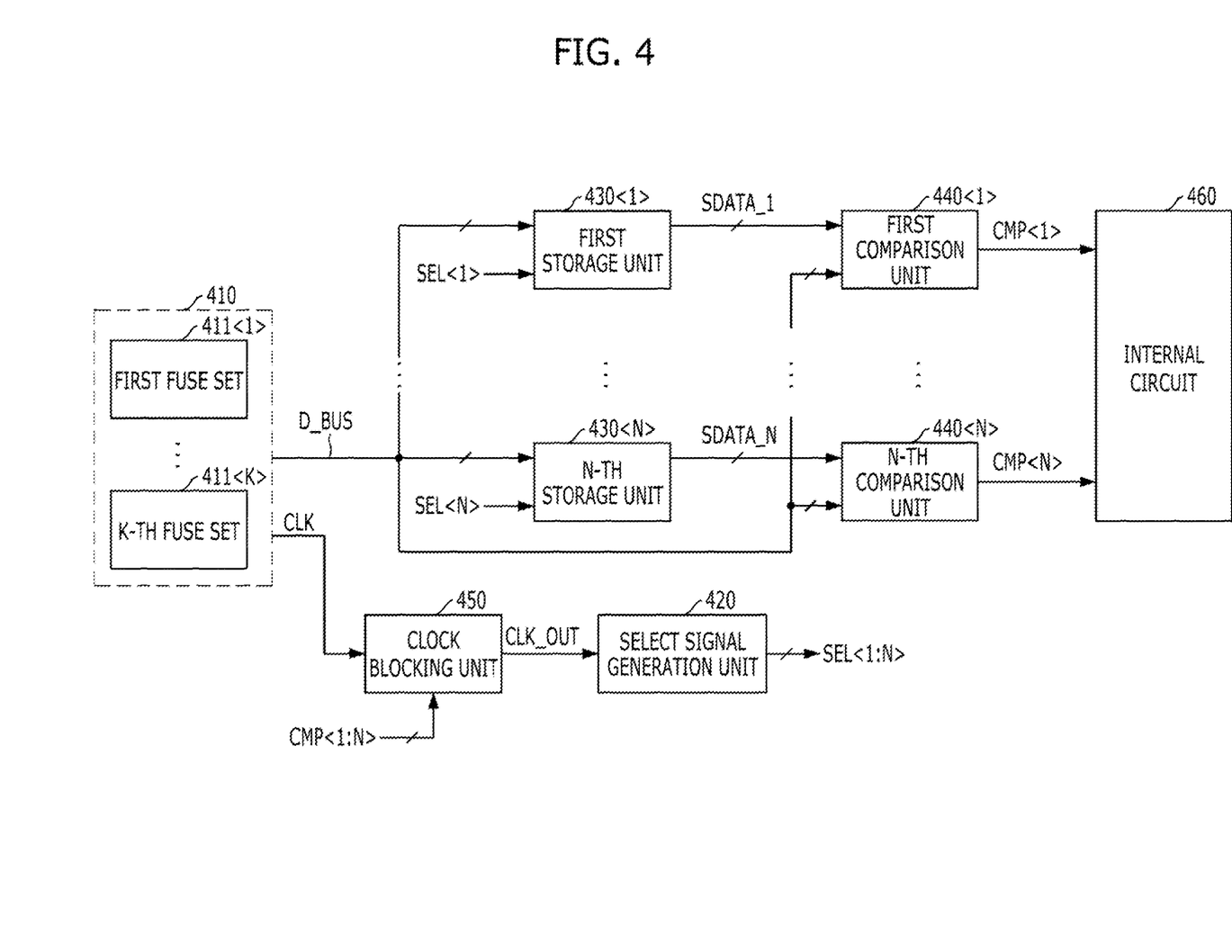
FIG. 4 is a configuration diagram of a semiconductor device in accordance with an embodiment of the present invention.

FIG. 4 is a configuration diagram of a semiconductor device in accordance with an embodiment of the present invention.

As illustrated in FIG. 4, the semiconductor device may include a nonvolatile storage unit 410, a select signal generation unit 420, a plurality of storage units 430<1:N>, a plurality of comparison units 440<1:N>, a clock blocking unit 450, and an Internal circuit 460.

Referring to FIG. 4, the semiconductor device will be described.

The nonvolatile storage unit 410 may store data to be transmitted to the plurality of storage units 430<1:N>. The data outputted from the nonvolatile storage unit 410 may be transmitted to the plurality of storage units 430<1:N> through a data bus D_BUS. A clock CLK may be outputted from the nonvolatile storage unit 410 at the same time. The clock CLK may be synchronized with the data of the data bus D_BUS. The nonvolatile storage unit 410 may include an E-fuse array or various nonvolatile memories such as flash memory and EEPROM.

The select signal generation unit 420 may generate a plurality of select signals SEL<1:N> using the clock CLK. The select signal generation unit 420 may sequentially enable one select signal among the select signals SEL<1:N>, whenever the clock CLK is enabled. For example, when the clock CLK is enabled for the first time, the select signal generation unit 420 may enable the first select signal SEL<1>, and when the clock CLK is enabled for the second time, the select signal generation unit 420 may enable the second select signal SEL<2>.

Each of the storage units 430<1:N> may include a plurality of latches corresponding to the bit number of data transmitted to the data bus D_BUS. Each of the storage units 430<1:N> may be activated in response to a corresponding select signal among the select signals SEL<1:N>, and the activated storage unit may receive and store the data transmitted to the data bus D_BUS. For example, when the first select signal SEL<1> is activated, the first storage unit 430<1> may receive and store the data transmitted to the data bus D_BUS, and when the N-th select signal is activated, the N-th storage unit 430<N> may receive and store the data transmitted to the data bus D_BUS.

The plurality of comparison units 440<1:N> may compare data SDATA1 to SDATA_N outputted from the respective storage units 430<1:N> to the data transmitted through the data bus D_BUS from the nonvolatile storage unit 410. The plurality of comparison units 440<1:N> may generate the plurality of comparison signals CMP<1:N>, respectively. Based on the comparison result, the plurality of comparison units 440<1:N> may enable the respective comparison signals CMP<1:N> when the data of the corresponding storage units is the same as the data transmitted from the nonvolatile storage unit 410, and disable the respective comparison signals CMP<1:N> when the data of the corresponding storage units is different from the data transmitted from the nonvolatile storage unit 410.

The clock blocking unit 450 may transmit a clock CLK outputted from the nonvolatile storage unit 410 to the select signal generation unit 420, and block the clock CLK when the same data transmitted from the nonvolatile storage unit 410 is included in the data of the plurality of storage units 430<1:N>. The clock blocking unit 450 may output the clock CLK directly as an output CLK_OUT. At this time, the clock blocking unit 450 may receive the plurality of comparison signals CMP<1:N>. When one or more comparison signals among the plurality of comparison signals CMP<1:N> are activated, the clock blocking unit 450 may not output the clock CLK and may disable the output CLK_OUT. When the clock CLK is blocked, the select signal generation unit 420 may disable all of the select signals SEL<1:N> such that the data transmitted from the nonvolatile storage unit 410 is not stored in the storage units 430<1:N>.

The internal circuit 460 is a circuit which uses the data stored in the plurality of storage units 430<1:N> inside the semiconductor device. For example, the Internal circuit 460 may include a circuit which performs a specific setting operation using the data stored in the plurality of storage units 430<1:N>. Furthermore, when the semiconductor device is a memory device, the internal circuit 460 may include a circuit which performs a repair operation using the data stored in the plurality of storage units 430<1:N>. In this case, the data may include repair addresses.

When the nonvolatile storage unit 410 is an E-fuse array, the nonvolatile storage unit 410 may include first to K-th fuse sets 411<1:K>. Each of the fuse sets 411<1:K> may include a plurality of fuse circuits to store multi-bit data. When data is stored in the nonvolatile storage unit 410, the data may be sequentially stored in the first to K-th fuse sets 411<1:K>. That is, data may be stored in the first fuse first 411<1> for the first time, data may be stored in the second fuse first 411<2> for the second time, data may be sequentially stored in the following fuse sets, and data may be stored in the K-th fuse 411<K> for the last time.

When transmitting data to the plurality of storage units 430<1:N>, the nonvolatile storage unit 410 may sequentially transmit the data from the data stored in the K-th fuse set 411<K> to the data stored in the first fuse set 411<1>. The nonvolatile storage unit 410 may transmit the data of the fuse sets 411<1:K> to the plurality of storage units 430<1:N> in the reverse order to the order in which the data is stored in the nonvolatile storage unit 410. That is, the data of the K-th fuse set 411<K> may be transmitted for first, the data of the (K−1)-th fuse set 411<K−1> may be transmitted second, the data of the following fuse sets may be sequentially transmitted, and the data of the first fuse set 411<1> may be transmitted last. In short, data stored in the nonvolatile storage unit 410 later may be transmitted earlier.

Hereafter, a case in which the same data is stored in the third and eighth fuse sets 411<3> and 411<8> of the nonvolatile storage unit 410 will be described as an example to explain the operation of the semiconductor device.

When the nonvolatile storage unit 410 starts data transmission, a clock CLK may be outputted. Whenever the clock CLK is activated once, data outputted from one fuse set may be transmitted and stored in an enabled storage unit. The data stored in the K-th fuse set 411<K> to the fourth fuse 411<4> may be sequentially transmitted and stored in the first to (K−3)-th storage units 430<1> to 430<K−3>, respectively. When the data of the third fuse set 411<3> is transmitted, the (K−7)-th comparison unit 440<K−7> corresponding to the (K−7)-th storage unit 430<K−7> storing the same data as the data of the third fuse set 411<3> may enable the (K−7)-th comparison signal CMP<K−7>. The clock blocking unit 450 may block the clock CLK in response to the (K−7)-th comparison signal CMP<K−7>. Then, as all of the select signals SEL<1:N> are deactivated, the data of the third fuse set 411<3> is not stored.

Then, the data of the other fuse sets is sequentially transmitted and stored in the storage units, and the data transmission is completed.

As such, the semiconductor device does not store duplicate data among the data transmitted from the nonvolatile storage unit 410. Thus, the semiconductor device may prevent an error which may occur in the internal circuit 460 due to the duplicate data.

Figure 5:
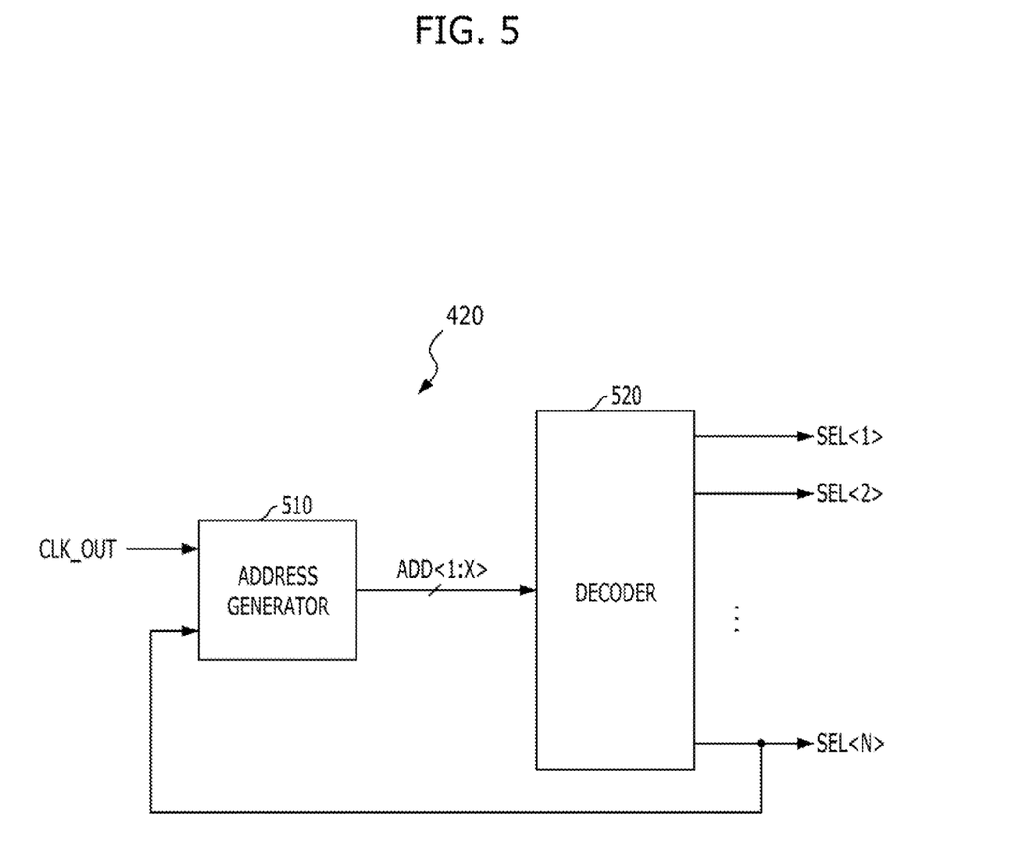
FIG. 5 is a configuration diagram of a select signal generation unit 420 of FIG. 4.

FIG. 5 is a configuration diagram of the select signal generation unit 420 of FIG. 4.

As illustrated in FIG. 5, the select signal generation unit 420 may include an address generator 510 and a decoder 520.

The address generator 510 may count the output CLK_OUT of the clock blocking unit 450 and generate an address ADD<1:X>. As described above, when the number of select signals is N, the address ADD<1:X> may include a binary code having at least X bits where X is a natural number satisfying $2^X \geq N$. The address generator 510 may be designed using a counter.

The decoder 520 may decode the address ADD<1:X> and generate the select signals SEL<1:N>. As described above, the address ADD<1:X> may be configured as an X-bit binary code. Thus, when the address ADD<1:X> is decoded, $2^X$ combinations may be generated at most. The combinations may be associated with the select signals SEL<1:N>, respectively. When a combination corresponding to a select signal is inputted, the select signal may be enabled.

When the last select signal SEL<N> Is activated, data may be stored in all of the storage units 430<1:N>. Thus, select signals do not need to be activated again and when the last select signal SEL<N> is enabled, the address generator 510 and the decoder 520 may be deactivated in response to the activation of the last select signal SEL<N>. Finally, all of the select signals SEL<1:N> may continuously maintain the disabled state.

Figure 6:
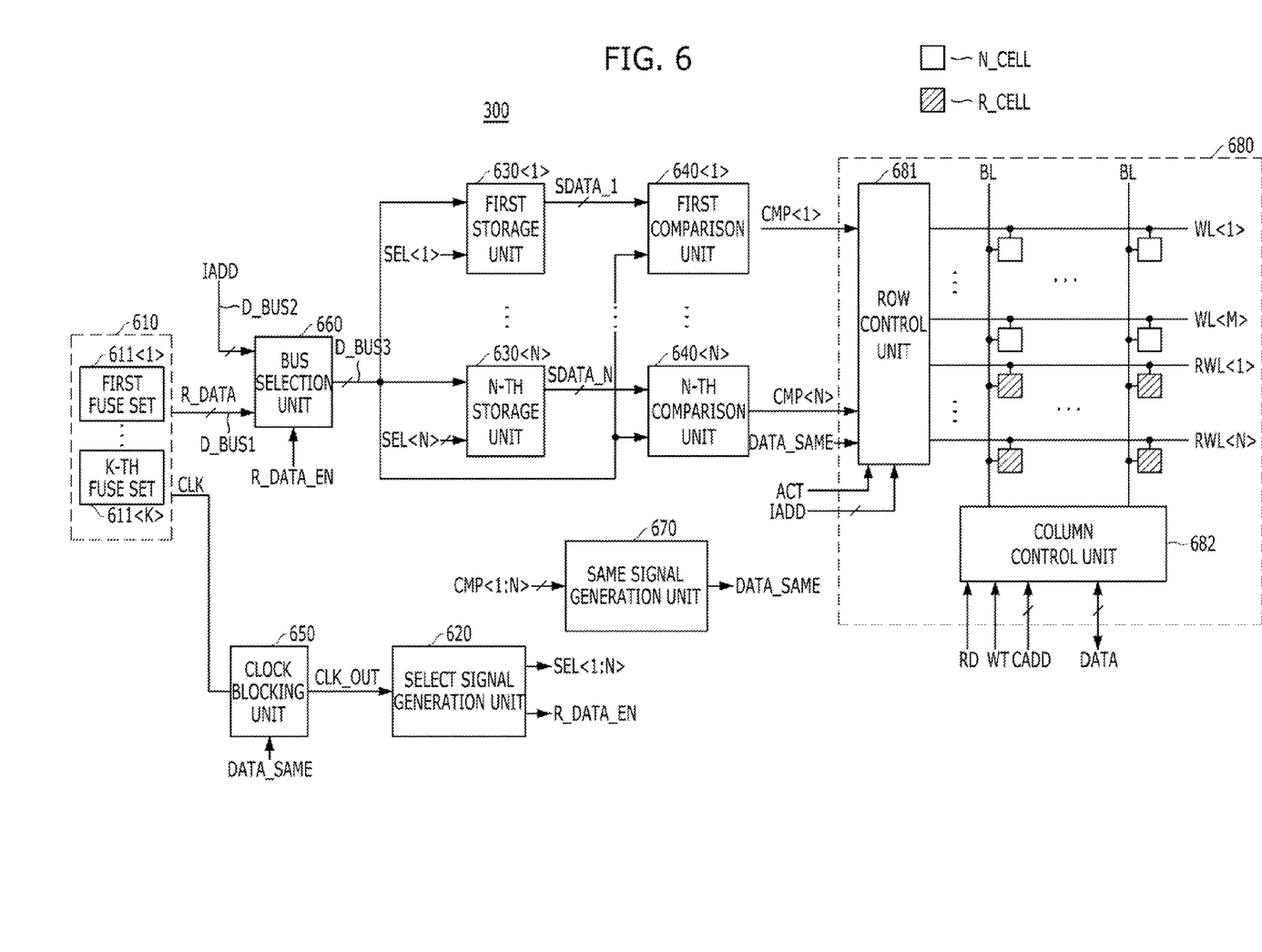
FIG. 6 is a configuration diagram of a semiconductor device in accordance with an embodiment of the present invention.

FIG. 6 is a configuration diagram of a semiconductor device in accordance with an embodiment of the present invention.

FIG. 6 illustrates a case in which a semiconductor memory device performs a repair operation to replace a normal cell N_CELL with a redundancy cell R_CELL using data stored in a nonvolatile storage unit 610.

As illustrated in FIG. 6, the semiconductor device may include a nonvolatile storage unit 610, a select signal generation unit 620, a plurality of storage units 630<1:N>, a plurality of comparison units 640<1:N>, a clock blocking unit 650, a bus selection unit 660, a same signal generation unit 670, a cell array 680, and first to third data buses D_BUS1 to D_BUS3.

The nonvolatile storage unit 610 may store repair data R_DATA corresponding to the address of a normal cell N_CELL, which has a defect and is to be replaced with a redundancy cell R_CELL, among a plurality of normal cells N_CELL included in the cell array 680. In the example illustrated in FIG. 6, the repair operation may include replacing a defective word line WL with a redundancy word line RWL. Thus, the repair data R_DATA may include the address of a word line which has a defect and is to be replaced with a redundancy word line.

The repair data R_DATA outputted from the nonvolatile storage unit 610 may be inputted to the bus selection unit 660 through the first data bus D_BUS1. A clock CLK may be outputted from the nonvolatile storage unit 610 at the same time. The clock CLK may be synchronized with the data R_DATA of the first data bus D_BUS1. The nonvolatile storage unit 610 may include an E-fuse array or various nonvolatile memories such as flash memory and EEPROM.

The bus selection unit 660 may select data transmitted through the first data bus D_BUS1 and output the selected data to the third data bus D_BUS3 during a boot-up operation. Furthermore, the bus selection unit 660 may select data transmitted through the second data bus D_BUS2 and output the selected data to the third data bus D_BUS3 during an access operation, for example, an active operation. At this time, an address IADD may be inputted from outside the semiconductor device to the bus selection unit 660 through the second data bus D_BUS2. A repair data enable signal R_DATA_EN is enabled while the repair data R_DATA stored in the nonvolatile storage unit 610 is transmitted to the plurality of storage units 630<1:N> during the boot-up operation. When the repair data enable signal R_DATA_EN is enabled, the bus selection unit 660 may select the data of the first data bus D_BUS1 and output the selected data to the third data bus D_BUS3. When the repair data enable signal R_DATA_EN is disabled, the bus selection unit 660 may select the data of the second data bus D_BUS2 and output the selected data to the third data bus D_BUS3.

The select signal generation unit 620 may generate a plurality of select signals SEL<1:N> using the clock CLK. The select signal generation unit 620 may sequentially enable one select signal of the select signals SEL<1:N>, whenever the clock CLK is activated. For example, when the clock CLK is enabled for the first time, the select signal generation unit 620 may enable the first select signal SEL<1>. When the clock CLK is enabled for the second time, the select signal generation unit 620 may enable the second select signal SEL<2>. The select signal generation unit 620 may enable the repair data enable signal R_DATA_EN from the time when the first select signal SEL<1> is enabled to the time when the N-th select signal SEL<N> is enabled.

Each of the storage units 630<1:N> may include a plurality of latches corresponding to the bit number of the data transmitted to the third data bus D_BUS3. Furthermore, each of the storage units 630<1:N> may be enabled in response to a corresponding select signal of the select signals SEL<1:N>, and the enabled storage unit may receive and store the data transmitted to the third data bus D_BUS3. For example, when the first select signal SEL<1> is enabled, the first storage unit 630<1> may receive and store the data transmitted to the third data bus D_BUS3. When the N-th select signal SEL<N> is enabled, the N-th storage unit 630<N> may receive and store the data transmitted to the third data bus D_BUS3.

The plurality of comparison units 640<1:N> may compare data SDATA_1 to SDATA_N, outputted from the respective storage units 630<1:N>, to the data transmitted through the third data bus D_BUS3. The plurality of comparison units 640<1:N> may generate a plurality of comparison signals CMP<1:N>, respectively. In this case, based on the comparison results, when the data of the corresponding storage units is the same as the data transmitted through the third data bus D_BUS3, the comparison units 640<1:N> may enable the respective comparison signals CMP<1:N>, and when the data of the corresponding storage units is different from the data transmitted through the third data bus D_BUS3, the comparison units 640<1:N> may disable the respective comparison signals CMP<1:N>. During the boot-up operation, the plurality of comparison signals CMP<1:N> may be generated based on results obtained by comparing the repair data R_DATA transmitted from the nonvolatile storage unit 610 to the data stored in the plurality of storage units 630<1:N>. During the access operation, for example, an active operation, the plurality of comparison signals CMP<1:M> may be generated based on results obtained by comparing the input address IADD to the data stored in the plurality of storage units 630<1:N>.

The clock blocking unit 650 may transmit the clock CLK outputted from the nonvolatile storage unit 610 to the select signal generation unit 620. When the same data as the data transmitted from the nonvolatile storage unit 610 is included in the data of the plurality of storage units 630<1:N>, the clock blocking unit 650 may block the clock CLK. The clock blocking unit 650 may output the clock CLK directly as an output CLK_OUT. At this time, when a same signal DATA_SAME is enabled, the clock blocking unit 650 may not output the clock CLK, and may disable the output CLK_OUT. When the clock CLK is blocked, the select signal generation unit 620 may disable all of the select signals SEL<1:N> such that the data of the third data bus D_BUS3 is not stored in the storage units 630<1:N>.

The same signal generation unit 670 may refer to the comparison results of the plurality of comparison units 640<1:N>, and generate the same signal DATA_SAME which is enabled when one or more of the storage units 630<1:N> store the same data as the data transmitted to the third data bus D_BUS3, and disabled when no storage units store the same data as the data transmitted to the third data bus D_BUS3. The same signal generation unit 670 may receive the plurality of comparison signals CMP<1:N>, and enable the same signal DATA_SAME when one or more of the plurality of comparison signals CMP<1:N> are enabled, or disable the same signal DATA_SAME when all of the comparison signals CMP<1:N> are disabled.

The cell array 680 may include a plurality of normal cells N_CELL and a plurality of redundancy cells R_CELL. The plurality of normal cells N_CELL and the plurality of redundancy cells R_CELL may be coupled to the word lines WL<1:M> and RWL<1:N> and bit lines BL. The cell array 680 may include a row control unit 681 and a column control unit 682 for controlling the normal cells N_CELL and the redundancy cells R_CELL.

When the active signal ACT is enabled, the row control unit 681 may activate a word line corresponding to the input address IADD among the plurality of word lines WL<1:M> when the same signal DATA_SAME is disabled, and activate a redundancy word line corresponding to an enabled comparison signal among the plurality of redundancy word lines RWL<1:N> when the same signal DATA_SAME is enabled. The column control unit 342 may write or read data DATA to or from cells N_CELL and R_CELL coupled to bit lines BL corresponding to a column address CADD among cells N_CELL and R_CELL coupled to the activated word line, when a write signal WT or a read signal RD is activated.

When the nonvolatile storage unit 610 is an E-fuse array, the nonvolatile storage unit 610 may include first to K-th fuse sets 611<1:K>. Each of the fuse sets 611<1:K> may include a plurality of fuse circuits to store multi-bit data. When data is stored in the nonvolatile storage unit 610, the data may be sequentially stored in the first to K-th fuse sets 611<1:K>. That is, data may be stored in the first fuse set 611<1> first, data may be stored in the second fuse set 611<2> second, data may be sequentially stored in the following fuse sets, and data may stored in the K-th fuse set 611<K> last.

When transmitting data to the plurality of storage units 630<1:N>, the nonvolatile storage unit 610 may sequentially transmit the data from the data stored in the K-th fuse set 611<K> to the data stored in the first fuse set 611<1>. The nonvolatile storage unit 610 may transmit the data of the fuse set 611<1:K> to the plurality of storage units 630<1:N> in reverse if the order in which the data is stored. That is, the data of the K-th fuse set 611<K> may be transmitted first, the data of the (K-1)-th fuse set 611<K-1> may be transmitted second, the data of the following fuse sets may be sequentially transmitted, and the data of the first fuse set 611<1> may be transmitted last. In short, data stored in the nonvolatile storage unit 610 later may be transmitted earlier.

Hereafter, the case in which the same data is stored in the third and eighth fuse sets 611<3> and 611<8> of the nonvolatile storage unit 610 will be described as an example to explain the operation of the semiconductor device.

When the nonvolatile storage unit 610 starts data transmission, the clock CLK may be outputted. Whenever the clock CLK is enabled once, data outputted from one fuse set may be transmitted and stored in an enabled storage unit. Data stored in the K-th fuse set 611<K> to the fourth fuse set 611<4> may be sequentially transmitted and stored in the first to (K-3)-th storage units 630<1> to 630<K-3>, respectively. When the data of the third fuse set 611<3> is transmitted, the (K-7)-th comparison unit 640<K-7> corresponding to the (K-7)-th storage unit 630<K-7> storing the same data as the data of the third fuse set 611<3> may enable the K-7 comparison signal CMP<K-7>. The same signal generation unit 670 may enable the same signal DATA_SAME in response to the K-7 comparison signal CMP<K-7>. The clock blocking unit 650 may block the clock CLK in response to the same signal DATA_SAME. Then, as all of the select signals SEL<1:N> are disabled, the data of the third fuse set 611<3> may not be stored. Next, the data of the other fuse sets may be sequentially transmitted and stored in the storage units, and the data transmission may be completed.

As such, the semiconductor device may not store duplicate data among the data transmitted from the nonvolatile storage unit 610. When the duplicate data is stored in the first to N-th storage units 630<1:N> as described with reference to FIG. 3, two or more redundancy word lines may be activated in response to one active signal. Thus, it is possible to prevent the collision of data stored in redundancy cells R_CELL coupled to the activated word lines.

Figure 7:
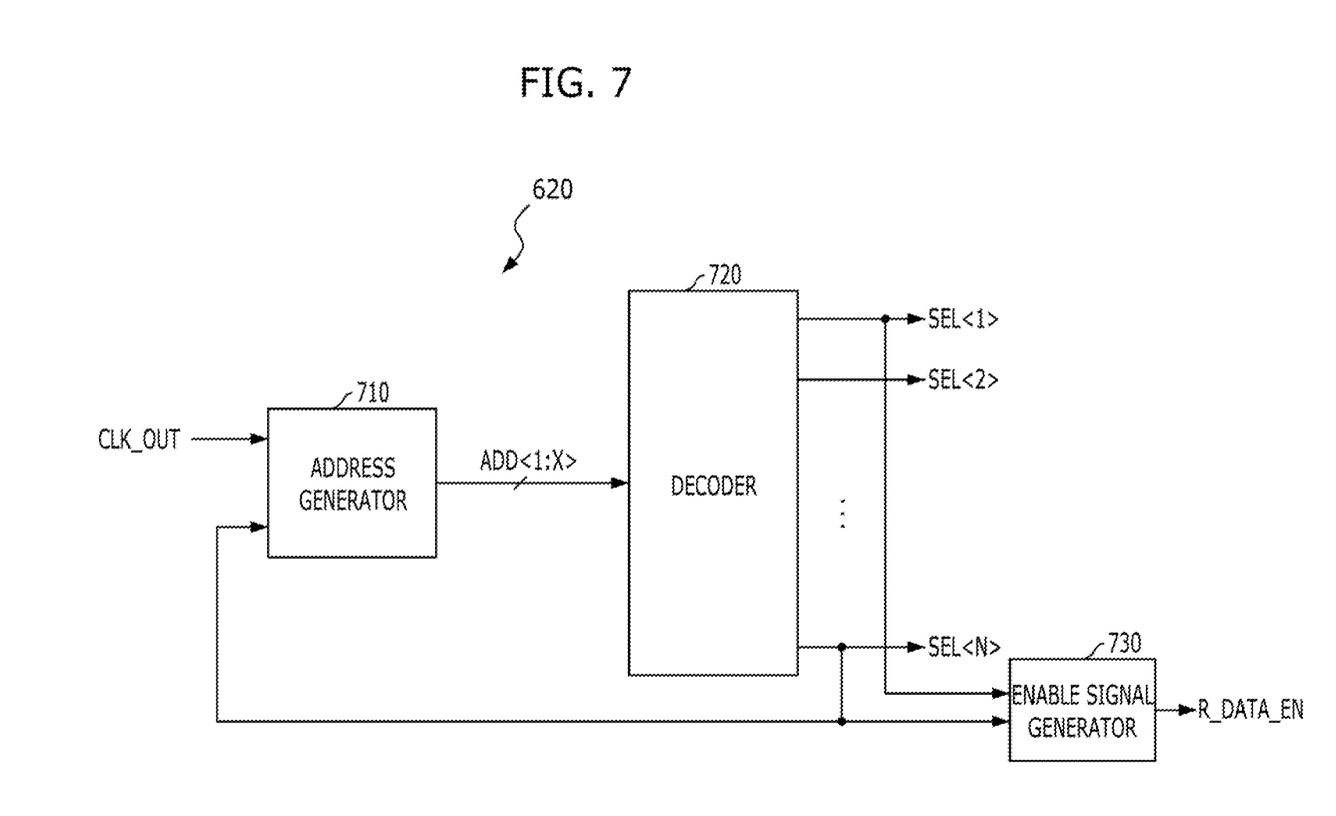
FIG. 7 is a configuration diagram of a select signal generation unit 620 of FIG. 6.

FIG. 7 is a configuration diagram of the select signal generation unit 620 of FIG. 6.

As illustrated in FIG. 7, the select signal generation unit 620 may include an address generator 710, a decoder 720, and an enable signal generator 730.

The address generator 710 may count the output CLK_OUT of the clock blocking unit 650 and generate an address ADD<1:X>. As described above, when the number of select signals is N, the address ADD<1:X> may include a binary code having at least X bits where X is a natural number satisfying $2^X \geq N$. The address generator 710 may be designed using a counter.

The decoder 720 may decode the address ADD<1:X> and generate the select signals SEL<1:N>. As described above, the address ADD<1:X> may be configured as an X-bit binary code. Thus, when the address ADD<1:X> is decoded, $2^X$ combinations may be generated at most. The combinations may be associated with the select signals SEL<1:N>, respectively. When a corresponding combination is inputted, the decoder 720 may enable a corresponding select signal.

When the last select signal SEL<N> is activated, data may be stored in all of the storage units 630<1:N>. Thus, select signals do not need to be activated again and when the last select signal SEL<N> is activated, the address generator 710 and the decoder 720 may be deactivated in response to the activation of the last select signal SEL<N>. Finally, all of the select signals SEL<1:N> may continuously maintain the disabled state.

The enable signal generator 730 may generate the repair data enable signal R_DATA_EN. When the first select signal SEL<1> is enabled, the enable signal generator 730 may enable the repair data enable signal R_DATA_EN, and when the N-th select signal SEL<N> is disabled, the enable signal generator 730 may disable the repair data enable signal R_DATA_EN.

For reference, M, N, and K may be a natural number of which the value differs depending on circuit design. In the above embodiments, the operation of replacing a normal word line with a redundancy word line has been described. However, the semiconductor device of FIGS. 4 and 6 may be applied to an operation of storing a column address and replacing a normal bit line with a redundancy bit line.

In accordance with the embodiments of the present invention, when duplicate repair data is transmitted to the storage units from the nonvolatile storage unit of the semiconductor device, the semiconductor device may not to store the duplicate repair data in the storage units.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a nonvolatile storage unit;
   a select signal generation unit for generating a plurality of select signals using a clock;
   a plurality of storage units for storing data transmitted from the nonvolatile storage unit in response to the plurality of select signals, respectively; and
   a clock blocking unit for blocking the clock inputted to the select signal generation unit when the data transmitted from the nonvolatile storage unit is the same as the data stored in the plurality of storage units.

2. The semiconductor device of claim 1, wherein the nonvolatile storage unit comprises first to M-th fuse sets, and sequentially stores data in the first to M-th fuse sets, wherein the M is natural number.

3. The semiconductor device of claim 2, wherein the nonvolatile storage unit sequentially transmits the data stored in the M-th fuse set to the first fuse set to the plurality of storage units.

4. The semiconductor device of claim 1, further comprising:
   a plurality of comparison units for outputting comparison results obtained by comparing data outputted from the respective storage units to the data transmitted from the nonvolatile storage unit.

5. The semiconductor device of claim 4, wherein the clock blocking unit transmits the clock to the select signal generation unit or blocks the clock based on the comparison results of the plurality of comparison units.

6. The semiconductor device of claim 1, wherein the select signal generation unit sequentially enables the plurality of select signals when the clock is enabled.

7. The semiconductor device of claim 1, wherein the clock is synchronized with the data transmitted from the nonvolatile storage unit and outputted from the nonvolatile storage unit.

8. The semiconductor device of claim 1, wherein the select signal generation unit comprises:
   an address generator for counting the clock and generating an address; and
   a decoder for decoding the address and generating the plurality of select signals.

9. A semiconductor device comprising:
   a nonvolatile storage unit for storing repair data;
   a select signal generation unit for generating a plurality of select signals using a clock;
   a plurality of storage units for storing the repair data transmitted from the nonvolatile storage unit in response to the plurality of select signals, respectively;
   a clock control unit for blocking the clock inputted to the select signal generation unit when the data transmitted from the nonvolatile storage unit is the same as the data stored in the plurality of storage units; and
   a cell array for replacing a normal cell with a redundancy cell using data stored in the plurality of storage units.

10. The semiconductor device of claim 9, wherein the nonvolatile storage unit comprises first to M-th fuse sets, and sequentially stores the repair data in the first to M-th fuse sets, wherein the M is natural number.

11. The semiconductor device of claim 10, wherein the nonvolatile storage unit sequentially transmits the repair data stored in the M-th fuse set to the first fuse set to the plurality of storage units.

12. The semiconductor device of claim 9, further comprising:
   a first data bus for transmitting the repair data outputted from the nonvolatile storage unit;
   a second data bus for transmitting an input address inputted to the semiconductor device;
   a bus selection unit for selecting and outputting data transmitted from the first data bus during a boot-up operation, and selecting and outputting data transmitted from the second data bus during an access operation; and
   a third data bus for transmitting data outputted from the bus selection unit to the plurality of storage units.

13. The semiconductor device of claim 12, further comprising:
   a plurality of comparison units for outputting comparison results obtained by comparing data outputted from the respective storage units to data transmitted from the third data bus.

14. The semiconductor device of claim 13, further comprising:
   a same signal generation unit for generating a same signal, which is enabled when one or more of the storage units store the same data as the data transmitted from the third data bus and disabled when the storage units store different data from the data transmitted from the third data bus, based on the comparison.

15. The semiconductor device of claim 14, wherein the clock blocking unit transmits the clock to the select signal generation unit when the same signal is disabled, and blocks the clock when the same signal is enabled.

16. The semiconductor device of claim 14, wherein the cell array accesses a normal cell corresponding to the input address when the same signal is disabled, and accesses a redundancy cell replacing the normal cell corresponding to the input address when the same signal is enabled.

17. The semiconductor device of claim 9, wherein the select signal generation unit sequentially enables the plurality of select signals when the clock is enabled.

18. The semiconductor device of claim 9, wherein the repair data comprise addresses of normal cells having a defect among normal cells included in the cell array.

19. A semiconductor device comprising:
   a nonvolatile storage unit for storing and sequentially transmitting a plurality of data;
   one or more storage units for storing data transmitted from the nonvolatile storage unit in response to respective select signals;
   one or more comparison units for comparing data stored in the respective storage units with the data transmitted from the nonvolatile storage unit and outputting a comparison result; and
   a select signal generation unit for sequentially enabling the select signals using a clock based on the comparison result.

20. The semiconductor device of claim 19, wherein the nonvolatile storage unit transmits the data in synchronization with the clock,
   wherein the select signal generation unit disables the select signals when the data transmitted from the nonvolatile storage unit is the same as the data stored in the storage units while sequentially enabling the select signals when the clock is enabled.

* * * * *